United States Patent [19]
Mehta et al.

[11] Patent Number: 5,999,449
[45] Date of Patent: Dec. 7, 1999

[54] TWO TRANSISTOR EEPROM CELL USING P-WELL FOR TUNNELING ACROSS A CHANNEL

[75] Inventors: Sunil D. Mehta; Xiao-Yu Li, both of San Jose, Calif.

[73] Assignee: Vantis Corporation, Sunnyvale, Calif.

[21] Appl. No.: 09/239,072

[22] Filed: Jan. 27, 1999

[51] Int. Cl.$^6$ .................................................. G11C 11/34
[52] U.S. Cl. ............................... 365/185.05; 365/185.28; 365/185.29
[58] Field of Search ........................ 365/185.05, 185.28, 365/185.29

[56] References Cited

U.S. PATENT DOCUMENTS

| | | | |
|---|---|---|---|
| 4,924,278 | 5/1990 | Logie | 357/23.5 |
| 5,457,652 | 10/1995 | Brahmbhatt | 365/185.06 |
| 5,487,033 | 1/1996 | Keeney et al. | 365/185.19 |
| 5,615,152 | 3/1997 | Bergemont | 365/185.18 |

*Primary Examiner*—David Nelms
*Assistant Examiner*—Tuan T. Nguyen
*Attorney, Agent, or Firm*—Fliesler, Dubb, Meyer & Lovejoy LLP

[57] ABSTRACT

A two transistor EEPROM cell is described that is programmed and erased by electron tunneling across a tunneling channel in a P-well. The EEPROM cell has two transistors formed in a semiconductor substrate. The two transistors are a tunneling transistor (NMOS) and a read transistor (NMOS). Electron tunneling occurs to program and erase the EEPROM cell through a tunnel oxide layer by electron tunneling across an entire portion of a tunneling channel upon incurrence of a sufficient voltage potential between a floating gate and the tunnel channel

21 Claims, 3 Drawing Sheets

TWO TRANSISTOR EEPROM CELL USING P-WELL FOR TUNNELING ACROSS A CHANNEL

BACKGROUND OF THE INVENTION

1. Field of the Invention

This invention relates generally to semiconductor devices, and more particularly, to an electrically erasable programmable read only memory ("EEPROM") cell.

2. Description of Related Art

The semiconductor community faces increasingly difficult challenges as it moves into production of semiconductor devices at feature sizes approaching 0.1 micron. Cell designs for typical semiconductor devices must be made more reliable, scalable, cost effective to manufacture and able to operate at lower power in order for manufacturers to compete in the semiconductor industry. EEPROM devices are one of such semiconductor devices that must meet these challenges.

EEPROM devices are generally known as read-only memory in which the memory cells that store information may be erased and reprogrammed electrically. An EEPROM cell is typically made up of three separate transistors, namely, a write transistor, a sense transistor and a read transistor. The EEPROM cell is able to be programmed, erased and read by removing or adding electrons to a floating gate. Thus, in one example, the floating gate is programmed by removing free electrons from the floating gate and thereby giving the floating gate a positive charge. When it is desired to erase the EEPROM cell in this example, the floating gate is given a net negative charge by injecting electrons onto the floating gate. The read operation is performed by reading the state (current) of the sense transistor In order to give the floating gate a positive charge (program) or negative charge (erase), electron tunneling, for example using the well-known Fowler-Nordheim tunneling technique, may be performed by applying the appropriate voltage potentials between the floating gate and a region, such as a drain region, of a transistor. Upon applying the appropriate voltage potentials, electron tunneling occurs through a tunnel oxide layer between the floating gate and the region.

As the feature sizes of EEPROM cells are scaled downward, the prior art EEPROM cells exhibit certain scaleablity, cost and reliability limitations. First, since three transistors (write, sense and read) form the typical EEPROM cells the size of the EEPROM cell is large. Also, with a three-transistor cell, three oxide layers are needed that may vary in thicknesses requiring complex process steps to form the three tunnel oxide layers of varying thicknesses. Second, the manufacturing process for a smaller EEPROM cell becomes more complex and, accordingly, manufacturing costs rise as transistor channel lengths are reduced. For example, as the channel length of a transistor of the EEPROM cell is scaled downward, the thickness of the gate oxide overlying the channel must also be reduced since the gate oxide thickness must be scaled with the channel length. In view of the fact that EEPROM cells already have a complex process to form multiple oxide thicknesses, additional oxide thicknesses for the transistors would add additional steps to further complicate the manufacturing process and thereby increase manufacturing costs.

In addition to this scaling problem, reliability problems also exist with previous EEPROM cells. First, the EEPROM cell is typically both programmed and erased through one tunnel oxide window of a transistor region that may deteriorate the cell quickly. In general, the tunnel oxide window deteriorates after tens of thousands of program/erase cycles and that deterioration cycle is shortened by only using the tunnel oxide window for both programming and erasing operations. Thus, the use of the window for both programming and erasing of the EEPROM cell causes the cell to be significantly less reliable. A further reliability limitation of previous EEPROM cells is that the tunnel oxide window is less reliable because it is formed over a highly doped program junction (PRJ). The high doping concentration of the PRJ degrades the surface immediately above the PRJ and thereby reduces the EEPROM cell's reliability. A still further limitation of the EEPROM cell is that the voltages needed to program, erase and read the cell are high due to the relatively large feature sizes of the cell. Thus, in order to achieve lower voltages to operate the EEPROM cell, feature sizes of the cell must be scaled downward.

Thus, a need exists for a redesigned EEPROM cell that (1) does not add costly steps to the manufacturing process, (2) does not suffer from reliability problems caused by both programing and erasing through one tunnel oxide window, (3) does not deteriorate through use of a PRJ oxide and (4) operates at a lower power by using smaller feature sizes.

SUMMARY OF THE INVENTION

A two transistor EEPROM cell is described that is programmed and erased by electron tunneling across a tunneling channel in a P-well formed within an N-well in a P type substrate. The EEPROM cell has two transistors: a tunneling transistor formed in a second well (P-well) within a first well (N-well) in the semiconductor substrate; and a read transistor also formed within the semiconductor substrate. The tunneling transistor has a tunneling source, a tunneling drain, and a tunneling channel between the tunneling source and the tunneling drain. The first well has a second conductivity type that is opposite the first conductivity type of the semiconductor substrate, while the second well has the first conductivity type. A tunnel oxide layer is formed over the tunneling channel, the tunneling source and the tunneling drain. A program junction region having the first conductivity type is formed in the well and separated from the tunneling transistor by a field oxide. The read transistor, also formed in the well, is electrically connected to the tunneling transistor through the tunneling drain. A floating gate overlies the tunnel oxide layer and the program junction oxide layer. Electron tunneling occurs through the tunnel oxide layer upon incurrence of a sufficient voltage potential between the floating gate and the tunneling channel to both program and erase the EEPROM cell.

The EEPROM cell of the present invention provides electron tunneling through the tunnel oxide layer overlying the tunneling channel to occur across the entire portion of the tunneling channel, thereby increasing the EEPROM cell reliability. The EEPROM cell further has reduced thicknesses for the tunnel oxide layer and the program junction oxide layer to improve scaleablity and reduce operating voltages of the EEPROM cell of the present invention. The EEPROM cell further has a reduced third oxide thickness in the periphery of an integrated circuit containing the EEPROM cell of the present invention that further lowers the voltages needed to operate the integrated circuit.

BRIEF DESCRIPTION OF THE DRAWINGS

A better understanding of the present invention can be obtained when the following detailed description of a preferred embodiment is considered in conjunction with the following drawings, in which.

Figure 1:
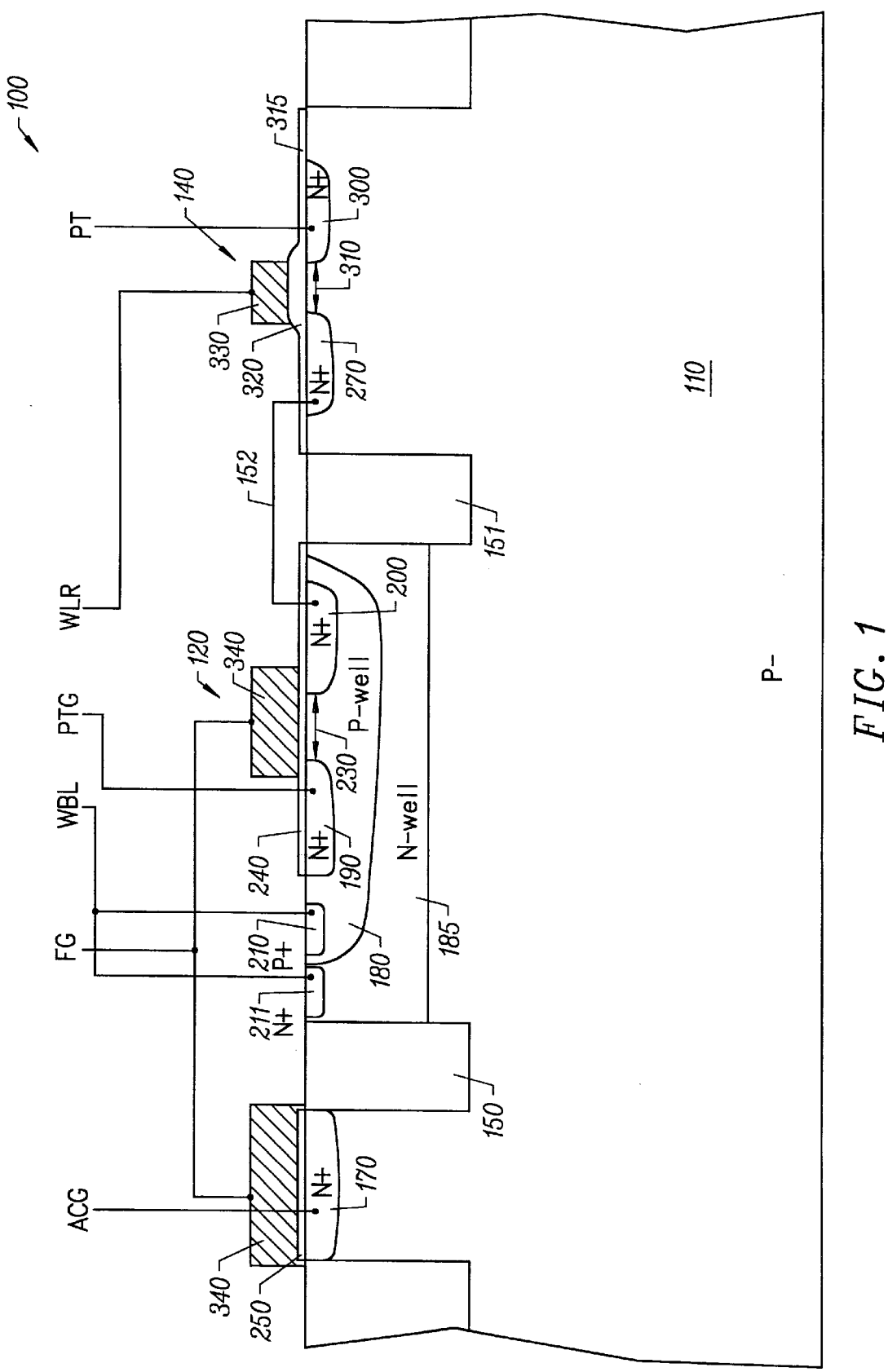
FIG. 1 is a cross-sectional view of an embodiment of the EEPROM cell of the present invention.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION

Alternative embodiments of the EEPROM cell of the present invention are described below, along with the general process for manufacturing those embodiments. The operation of those embodiments is then provided in Table 1 and described in detail to explain the programming, erasing and reading functions of the embodiment of the EEPROM cell of the present invention.

FIG. 1 is a cross-sectional view of an embodiment of the EEPROM cell of the present invention. In FIG. 1, the embodiment of the EEPROM cell 100 is formed on a semiconductor substrate 110, for example a silicon substrate, and has a first conductivity type, for example, a P conductivity type. In one embodiment, the semiconductor substrate is a bulk substrate being entirely formed of a P conductivity type material. In another embodiment, the semiconductor substrate is formed of a P conductivity type material having an epitaxial layer on a top surface where the epitaxial layer is formed of an P conductivity type material. The P and N conductivity type materials (known as dopants) are those materials commonly known in the art that alter the conductivity of a semiconductor material by contributing either a hole (P type) or an electron (N type) to the conduction process. For silicon substrates, the dopants are generally found in Groups III and V of the well-known chemical periodic table. In alternative embodiments, the semiconductor substrate 110 may be alternative silicon materials well-known in the semiconductor industry such as germanium, germanium/silicon, gallium arsenide, polysilicon, silicon on insulator or the like. The EEPROM cell 100 has two separate transistors formed in the semiconductor substrate 110, namely, a tunneling transistor 120 and a read transistor 140. A program junction region 170 is also formed in the semiconductor substrate 110 and is electrically separated from the tunneling transistor 120 by a field oxide 150, erg. silicon dioxide, also formed in the semiconductor substrate 110. A second field oxide 151 (e.g. silicon dioxide), in one embodiment, is also formed in the semiconductor substrate 110 and separates the tunneling transistor 120 from the read transistor 140. However, the read transistor 140 remains electrically connected to the tunneling transistor 120 through the electrical line 152 that connects the tunneling drain 200 to the read source 270. The program junction region 170 has an N conductivity type, such as an N+ conductivity type, and is a highly doped N+ region.

Returning to the tunneling transistor 120, the tunneling transistor 120 has a tunneling source 190 and a tunneling drain 200, all formed within a second well 180. The second well 180 has a first conductivity type, e.g. a P conductivity type. The second well 180 is formed within a first well 185 having a second conductivity type that is opposite the first conductivity type, eeg. an N type conductivity. It is understood that while the embodiment of FIG. 1 depicts the first well 185 as having an N conductivity type and the second well 180 as having a P conductivity type, alternative embodiments may have differing conductivity types as along as the conductivity types of the first and second wells are opposite conductivity types and the EEPROM cell 100 is able to function at the programming and erasing voltages provided below. A P+ region 210, having a P conductivity type, is formed in the second well 180 using conventional implant techniques in order to provide electrical connection between a Word Bit Line (WBL) to the second well 180. An N+ region 211, having an N conductivity type, is formed in the first well 185 using conventional implant techniques in order to provide electrical connection between the WBL to the first well 185. The first well 185 is needed to be tied to WBL to prevent the forward biasing of the p-n junction. The tunneling source 190 and tunneling drain 200 have the N conductivity type. The tunneling transistor 120 is therefore a NMOS transistor in this embodiment. By using a NMOS transistor in a P-well (second well 180) the entire tunneling channel 230 may be used to perform electron tunneling that has certain benefits as described below. This is because the second well 180, in addition to the tunneling source 190 and tunneling drain 200, may be electrically connected to WBL (through the P+ region 210) to create the appropriate potential across the entire tunneling channel 230 to allow the entire tunneling channel 230 to be used for electron tunneling.

The read transistor 140 and the program junction region 170 are also formed in the semiconductor substrate 110. A tunneling channel 230 is formed in the P-well 180 between the tunneling source 190 and tunneling drain 200. Overlying the tunneling source 190, the tunneling channel 230 and the tunneling drain 200 is a tunnel oxide layer 240. The tunnel oxide layer 240 is typically composed of an insulating material, such as silicon dioxide, and has a thickness in the range of approximately 70 to 90 angstroms, and in one embodiment, is approximately 80 angstroms. It is noted that such a thickness for the tunnel oxide layer 240 is considerably less than the approximate 150 angstroms or greater used in prior art devices which improves the EEPROM cell 100 scaleability. Overlying the program junction region 170 is a program junction oxide layer 250 that is composed of an insulating material, such as silicon dioxide. The program junction oxide layer 250 has a thickness in the range of approximately 80 to 105 angstroms, and in one embodiment, is approximately 96 angstroms, which is also an improvement over prior art devices that had thicknesses greater than 180 angstroms It is noted that while the thickness of the tunnel oxide layer 240 is approximately 80 angstroms and the thickness of the program junction oxide layer is 96 angstroms, both layers may be deposited or grown (using conventional oxide deposition techniques) in a single process step. This is because the program junction oxide layer 250 is grown on a highly doped N+ program junction region 170 that characteristically, as is well known to one skilled in the art, "expands" the thickness of the program junction oxide layer 250 to 96 angstroms, while the tunnel oxide layer 240, overlying the N type tunneling source 190 and the N type tunneling drain 200, remains at 80 angstroms. Thus, additional process steps, to form oxide layers with different thicknesses, are avoided. The tunneling transistor 120 is, in one embodiment, a depletion mode transistor, as is commonly understood in the industry. In a further embodiments the tunneling transistor 120 is an enhancement mode transistor (also is also commonly known in the industry). Depending on the mode of tunneling transistor 120 (depletion or enhancement mode), the relevant voltages for operating the EEPROM cell 100 are adjusted.

Returning to FIG. 1, the read source 270 of the read transistor 140 is electrically connected through electrical line 152, in one embodiment, to the tunneling drain 200. The read transistor 140 also has a read drain 300 that has an N conductivity type. Overlying the read drain 300 is a read drain oxide layer 315 that is composed of an insulating material, such a silicon dioxide, and has an approximate thickness of 80 angstroms. The read drain oxide layer 315 is formed in the same step as the tunnel oxide layer 240 and the program junction oxide layer 250. Between the read source 270 and the read drain 300 is a read channel 310. Overlying the read channel 310 is a read gate oxide layer 320 that has a thickness of approximately 150 angstroms and is composed of an insulating material, such as silicon dioxide. The formation of the read gate oxide layer 320 requires additional separate process steps then the oxide layers 240, 250 and 315 since the thickness of the read gate oxide layer 320 is considerably more than the others. A read gate 330 overlies the read gate oxide layer 320 and is composed of a conducting material, such as a polycrystalline silicon material. A floating gate 340 overlies the tunnel oxide layer 240 overlying the tunneling channel 230 of the tunneling transistor 120 and the program junction oxide layer 250. The floating gate 340 is also formed of a conducting material, such as a polycrystalline silicon material. It is noted that a third oxide (not shown), in addition to the tunnel oxide layer 240 and the read gate oxide layer 320, is used in a further embodiment in the periphery of an EEPROM device (not shown) incorporating the EEPROM cell 100. The third oxide is used to build a low voltage transistors that operate at supply voltages in the range of approximately 1.8 volts to 3.3 volts or less. The third oxide has an approximate thickness of 35 angstroms.

The transistors 120 and 140 of the EEPROM cell 100 are electrically connected to certain electrical lines and gates in order to operate and control the functions of the EEPROM cell 100. As shown in FIG. 1, the WBL is electrically connected to the second well 180 through the P+ region 210 to provide an electrical connection from WBL to the second well 180. The WBL is electrically connected to the second well 180 so that the entire portion of the tunneling channel 230 may be used to erase and program the EEPROM cell 100 as described below. The WBL is also electrically connected to the first well 185 through the N+ region 211. The WBL is electrically connected to the N+ region 211 to prevent forward biasing of the p-n junction. An Array Control Ground (ACG) is electrically connected to the program junction region 170 while a Product Term Ground (PTG) is electrically connected to the tunneling source 190 of the tunneling transistor 120. A Word Line Read (WLR) is electrically connected to the read gate 330 of the read transistor. A Product Term (PT) is electrically connected to the read drain 300. It is understood that electrical connecting includes any manner of transmitting charge between the two items being connected.

Figure 3:
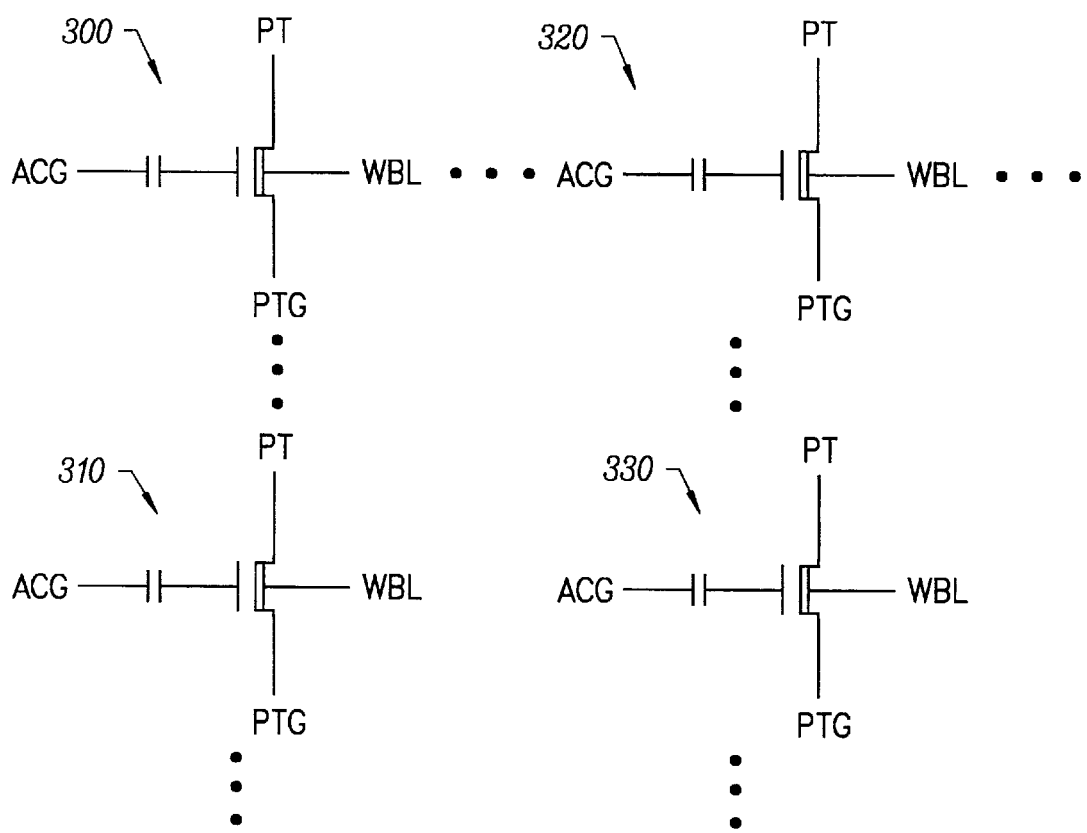
FIG. 3 is a circuit diagram view of an embodiment of an EEPROM array that includes the EEPROM cell of the present invention.

The method of manufacturing the EEPROM cell 100 of FIG. 1 includes standard deposition and etching techniques for forming the EEPROM cell 100 shown in FIG. 1. For example, in one embodiment, the EEPROM cell 100 is formed as follows. The semiconductor substrate 110, which may have an epitaxial layer (not shown) on the top surface of the semiconductor substrate 110, is patterned and etched (using conventional techniques) to form a deep trench in the semiconductor substrate 110 for the field oxide 150. The first well 185 is then formed by implanting the appropriate conductivity type, e.g. N conductivity type, into the semiconductor substrate 110. The second well 180 is then formed in the first well 185 by implanting the appropriate conductivity type, e.g. a P conductivity types into the first well 185. The tunnel oxide layer 240, the program junction oxide layer 250 and the read oxide layer 315 are then formed using common deposition or oxide growing techniques. In one embodiment, these layers are formed as follows. An oxide layer is grown across the entire semiconductor substrate having an approximate thickness of about 80 angstroms. Using conventional patterning techniques, the oxide layer is masked except for the area overlying the read channel 310. A second oxide layer having a thickness of approximately 70 angstroms is then formed over the oxide layer and the semiconductor surface overlying the read channel 310. At this point, an approximately 80 angstrom oxide layer overlies the entire semiconductor substrate 110, except for the area overlying the read channel 310 which has a second oxide layer of approximately 130 angstroms due to the combination of the two oxide layers. The periphery of an integrated circuit containing the EEPROM cell 100 is then etched to remove the first and second oxides and then a third oxide layer having a thickness of approximately 35 angstroms is grown. Now, the periphery of the integrated circuit has an approximately 35 angstrom thick oxide, the read gate oxide layer has an approximate thickness of 150 angstroms (combination of 130 angstroms and 35 angstroms) and the program junction oxide layer 250, tunnel oxide layer 240 and the read oxide layer 315 have an approximate thickness of 80 angstroms. After these oxide layers have been formed, the gates 340,330 for the transistors 120,140, including the floating gate 340, are formed and patterned using conventional techniques The gates are typically formed of a conducting material, erg. a polycrystalline silicon material. Next, the source and drain implants are formed for each transistor 120 and 140 and standard back end (as is commonly known to those skilled in the art) is performed. It is understood that a plurality of EEPROM cells are manufactured into an EEPROM device in order to store a multitude of information. This plurality of EEPROM cells form an EEPROM array as depicted in FIG. 3 described below. The EEPROM cell 100 of FIG. 1 further includes numerous metallization layers (not shown) overlying the cell 100 to electrically connect the cell 100 to other cells and other devices in an EEPROM device, as well as passivation layers (not shown) to protect the cell 100.

The three operations of the EEPROM cell 100 are program, erase and read. The various voltages applied to the EEPROM cell to perform these operations are shown in Table 1 below.

TABLE 1

|  | WBL | ACG | PTG | WLR | PT |
|---|---|---|---|---|---|
| Program (bulk) | ground | $V_{pp}$ | ground | $V_{cc}$ | ground |
| Erase (bit)-selected cell | $V_{pp}$ | ground | $V_{pp}/2$ | $V_{pp}+$ | $V_{pp}$ |
| Erase-unselected row of cells | $V_{pp}$ | $V_{pp}/2$ | $V_{pp}/2$ | $V_{pp}+$ | $V_{pp}/2$ |
| Erase-unselected column of cells | ground | ground | $V_{pp}/2$ | ground | $V_{pp}$ |
| Read (Depletion Mode) | ground | ground | ground | $V_{cc}$ | $V_{cc}/2$ |
| Read (Enhancement Mode) | ground | $V_{cc}$ | ground | $V_{cc}$ | $V_{cc}/2$ |

The program operation of the EEPROM cell 100 of FIG. 1 is defined, for this embodiment, as providing a net negative charge on the floating gate 340. For the erase operation, a positive charge is provided on the floating gate 340. It is understood, however, that alternative embodiments may deviate from this definition, yet fall within the scope of the present invention as claimed below. That is, the erase operation may put a negative charge on the floating gate 340 as long as the program operation puts the opposite charge (positive) on the erase operation. Thus, alternative embodiments may create potentials between the floating gate 340 and the appropriate channels that provide a net negative charge on the floating gate 340 to erase the EEPROM cell 100 of FIG. 1 and provide a positive charge on the floating gate 340 to program the EEPROM cell 100. Again, the erase operation is merely the consistent opposite of the program operation. In a further embodiment, the difference in charge level may differentiate between a program and erase operation Thus, by increasing a charge to a sufficient level, the operation may change from a program operation to an erase operation, or vice versa.

In order to program the EEPROM cell 100 of FIG. 1, in one embodiment, the floating gate 340 is given a negative charge by moving electrons to the floating gate 340. The method of moving electrons to the floating gate 340 is commonly known to those skilled in the art as Fowler-Nordheim tunneling. In general, this process has electrons tunnel through a barrier, for example a thin oxide layer, in the presence of a high electric field. However, unlike previous EEPROM cells that performed the electron tunneling through a small oxide window at the edge of a source or drain region, the present invention provides for electron tunneling across a transistor channel (tunneling channel 230). Further, the entire portion of the channel is used for electron tunneling rather than only an edge of a region as has been previously done since a NMOS transistor 120 in a P-well (second well 180) is used for the tunneling transistor 120. The advantages of such electron tunneling are described below.

In one embodiment, programming of the EEPROM cell 100 of FIG. 1 is performed by moving electrons to the floating gate 340 through the tunnel oxide layer 240 and across the entire portion of the tunneling channel 230. It is understood that the entire portion of the tunneling channel 230 means the distance between the tunneling source 190 and the tunneling drain 200 underlying the tunnel oxide layer 240. It is further understood that the EEPROM cell 100 of FIG. 1 is the selected cell to be programmed, rather than an unselected cell in an EEPROM array as shown in FIG. 3. In order to move the electrons to floating gate 340 to program the EEPROM cell 100, $V_{pp}$, for example 10 volts, is applied to ACG, while WBLF PT and PTG are grounded. Since the program junction region 170 is capacitively coupled to the floating gate 340 through the program junction oxide layer 250, approximately 8 volts is placed on the floating gate 340. WLR is set to $V_{cc}$, for example 1.8 volts. Since the floating gate 340 is at a high voltage and the tunneling drain 200 is grounded (through channel formation since the read transistor is on) as well as the substrate 110, a potential is created between the floating gate 340 and the tunneling channel 230. The tunnel oxide layer 240 immediately above the tunneling channel 230 has a thickness of approximately 80 angstroms, in one embodiment, so that electron tunneling occurs across the entire portion of the tunneling channel 230 and through the tunnel oxide layer 240 since the programming voltages previously mentioned provide a sufficient voltage potential between the floating gate 340 and the tunneling channel 230. The voltages provided in this embodiment may vary in alternative embodiments as long as a sufficient potential is created to move electrons through the tunnel oxide layer 240 onto the floating gate 340 across the tunneling channel 230. Likewise, the oxide layer thicknesses, of all oxide layers used for electron tunneling, may also vary as long as the thickness is sufficient to permit electron tunneling at the disclosed potentials. It is noted that the program function is done in bulk, while the erase function (described below) is done on individual bits.

To erase the floating gate 340, in this same embodiment, electrons are removed from the floating gate 340 through the tunnel oxide layer 240 across the entire portion of the tunnel channel 230 to give the floating gate 340 a positive charge. It is noted that since the erase function is done on individual bits, the appropriate voltages are applied to a the various cells in an EEPROM array as shown in FIG. 3 to ensure that the selected cell (bit) is erased while unselected cells are not erased.

FIG. 3 is a circuit diagram view of an embodiment of an EEPROM array that includes the EEPROM cell of the present invention. In FIG. 3, the selected cell 300 that is to be erased is shown along with an unselected cell in the same column of the selected cell (unselected column of cells 310) and an unselected cell in the same row as the selected cell (unselected row of cells 320). Also in FIG. 3 is another unselected row of cells 330 that has the same erase voltages as the unselected row of cells 320. To erase the selected cell 300 (EEPROM cell 100), $V_{pp}$, for example 10 volts, is applied to WBL, PT and WLR ($V_{pp}+$, e.g. 11.5 volts) while ACG is grounded PTG is provided $V_{pp}/2$, e.g. 5 volts. Since the second well 180 is at a relatively high voltage (11.5 volts) while the floating gate 340 is at a low voltage, a potential is created between the floating gate 340 across the entire portion of the tunnel channel 230 so that an electrons tunnel through the tunnel oxide layer 240 from the floating gate 340 across the entire portion of the tunnel channel 230 Again, the erasing operation, in this embodiment, is done bit by bit, while the programming operation is done in bulk (multiple cells are erased at one time).

To ensure that only the selected cell 300 (EEPROM cell 100) is erased by tunneling through the tunneling channel 230, the voltages on the unselected column 310 and row 320,330 cells must remain low to avoid tunneling and thereby being erased This is accomplished by providing the following voltages to the unselected column of cells (310) and the unselected row of cells (320,330) of FIG. 3. The unselected row of cells 320,330 are prevented from being erased by providing $V_{pp}/2$, e.g. 5 volts, to ACG, PT and PTG, while providing $V_{pp}$ to WBL, e.g. 10 volts, and $V_{pp}+$, e.g. 11.5 volts, to WLR. Since ACG is at a low voltage while WBL is a at high voltage, an insufficient voltage potential exists between the tunneling channel 230 and the floating gate 340 to permit electron tunneling to the floating gate 340 and therefore the unselected row of cells 320,330 are not erased. Likewise, the unselected column of cells 310 are prevented from being erased by grounding ACG, WBL and WLR, and providing $V_{pp}$, e.g. 10 volts, to PT and $V_{pp}/2$, e.g. 5 volts, to PTG. Again, at these voltages, an insufficient voltage potential exists between the tunneling channel 230 and the floating gate 340 to permit electron tunneling to the floating gate 340 and therefore the unselected column of cells 310 are not erased.

The EEPROM cell 100 has numerous advantages over previous EEPROM cells. First, the EEPROM cell is a two transistor device rather than a three transistor device which provides significant size improvements over prior art devices. Likewise, only two oxide regions 240,320 are formed, rather than three such regions in a three transistor device, which simplifies the manufacturing process. Second, the channel 230 is used to program and erase the EEPROM cell rather than the edge of a source or drain region. By using an NMOS transistor in a P-well (second well 180) for the tunneling transistor 120, the entire tunneling channel 230 may be used to perform electron tunneling. This is because the second well 180 may be electrically connected to a separate node (WBL) through the P– region 210 to allow the entire tunneling channel 230 to be used for electron tunneling. By tunneling across a channel, the reliability of the EEPROM cell is increased since a larger oxide, rather than a small oxide window, is used for programming and erasing operations. The EEPROM cell of FIG. 1 further has the advantage of having thinner oxide layers 240,250 which decreases the cell size. Prior art devices had oxide layer thicknesses in excess of 150 angstroms while the present oxide layers have angstroms in the range of 80 to 96 angstroms. Additionally, the present EEPROM cell 100 does not perform the electron tunneling through the PRJ 170 and therefore the tunnel oxide quality is not degraded which provides better cell data retention. Furthermore, the scaling of the tunnel oxide layer 240 from 96 to 80 angstroms means that $V_{pp}$ may also be scaled down which provides an EEPROM cell that operates at lower power. The EEPROM cell further has a reduced third oxide thickness (35 angstroms) in the periphery of an integrated circuit containing the EEPROM cell of the present invention that further lowers the voltages needed to operate the integrated circuit.

The EEPROM cell 100 of FIG. 1 is read by determining the state of tunneling transistor 120. In one embodiment, the tunneling transistor 120 is a depletion mode transistor in which WBL, ACG and PTG are grounded, WLR is set to $V_{cc}$, e.g. 1.8 volts, and PT is set to $V_{cc}/2$, e.g. 0.9 volts. If the tunneling transistor 120 is an enhancement mode transistor, ACG is set to $V_{cc}$, e.g. 1.8 volts, while the remaining voltages remain the same. Thus, the state of tunneling transistor 120 is a logical 1 during erase since a positive charge is on floating gate 340 while a logical 0 is the state of tunneling transistor 120 during program. The tunneling transistor 120 reads a logical 1 if current flows from tunneling source 190 to tunneling drain 200. If no current flows, a logical 0 results.

Figure 2:
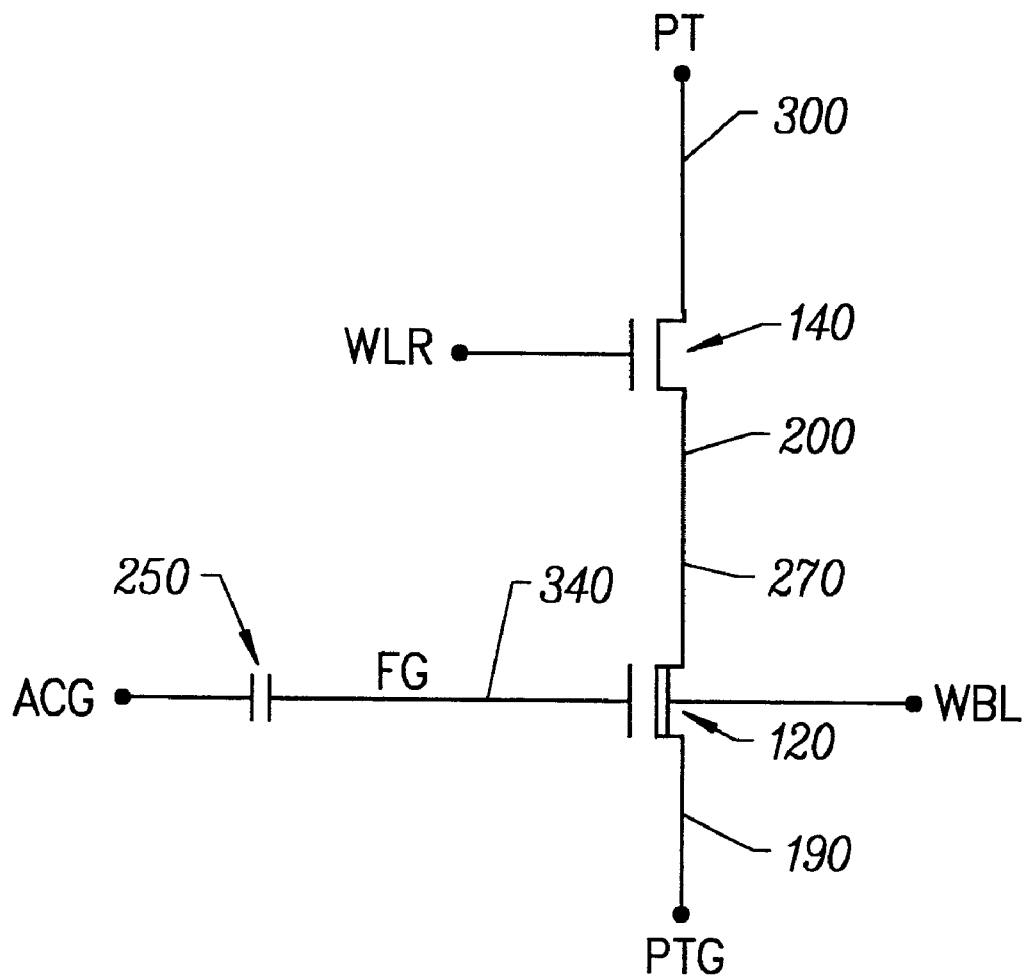
FIG. 2 is a circuit diagram view of an embodiment of the EEPROM cell of the present invention.

FIG. 2 is a circuit diagram view of the embodiment of the EEPROM cell of FIG. 1. In FIG. 2, the two transistors of FIG. 1 including the tunneling transistor 120 arid the read transistor 140 are shown. The tunneling transistor 120, through the second well 180, is shown to be electrically connected to WBL, while the tunneling source 190 is electrically connected to PTG and ACG is capacitively coupled through the tunnel oxide layer 250 to the floating gate 340.

The EEPROM cell of the present invention has been described in connection with the embodiments disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

What is claimed is:

1. An EEPROM cell, comprising:
    a semiconductor substrate, said semiconductor substrate having a first conductivity type;
    a first well formed in said semiconductor substrate, said first well having a second conductivity type opposite said first conductivity type;
    a second well formed in said first well, said second well having said first conductivity type;
    a tunneling transistor formed in said second well, said tunneling transistor having a tunneling source, a tunneling drain and a tunneling channel between said tunneling source and said tunneling drain, said tunneling drain and said tunneling source having said second conductivity type;
    a tunnel oxide layer overlying said tunneling channel, said tunneling source and said tunneling drain;
    a program junction region formed in said semiconductor substrate, said program junction region separated from said tunneling transistor by a field oxide region, said program junction region having said second conductivity type;
    a program junction oxide layer overlying said program junction region;
    a read transistor formed in said semiconductor substrates said read transistor having a read source and a read drain and a read channel between said read source and said read drain, said read transistor electrically connected to said tunneling transistor through said read source, said read source and said read drain having said second conductivity type; and
    a floating gate overlying said tunnel oxide layer and said program junction oxide layer.

2. The EEPROM cell of claim 1, wherein said first conductivity type is a P type conductivity.

3. The EEPROM cell of claim 2, wherein said second conductivity type is an N type conductivity.

4. The EEPROM cell of claim 1, wherein electron tunneling through said tunnel oxide layer overlying said tunneling channel occurs upon incurrence of a sufficient voltage potential between said floating gate and said tunneling channel.

5. The EEPROM cell of claim 4, wherein said electron tunneling through said tunnel oxide layer overlying said tunneling channel occurs across an entire portion of said tunneling channel.

6. The EEPROM cell of claim 4, wherein said electron tunneling through said tunnel oxide layer erases said EEPROM cell.

7. The EEPROM cell of claim 4, wherein said electron tunneling through said tunnel oxide layer programs said EEPROM cell.

8. The EEPROM cell of claim 4, further comprising:
    an array control ground (ACG) electrically connected to said program junction region;
    a product term ground (PTG) electrically connected to said tunneling source;
    a word bit line (WBL) electrically connected to said first well and said second well;
    a product term (PT) electrically connected to said read drain; and
    a word line read (WLR) electrically connected to said read transistor, wherein said WBL, ACG, PTG, PT and WLR provide said sufficient voltage potential between said floating gate and said tunneling channel.

9. The EEPROM cell of claim 8, wherein said sufficient voltage potential between said floating gate and said tunneling channel programs said EEPROM cell by providing approximately 10 volts to said ACG, approximately 0 volts to said WBL, said PTG and said PT, and approximately 1.8 volts to said WLR.

10. The EEPROM cell of claim 8, wherein said EEPROM cell is a selected cell of an EEPROM array, said EEPROM array further comprising an unselected row of cells and an unselected column of cells.

11. The EEPROM cell of claim 10, wherein said sufficient voltage potential between said floating gate and said tunneling channel erases said selected cell by providing approximately 0 volts to said ACG, approximately 10 volts to said WBL, said PT and said WLR and approximately 5 volts to said PTG to said selected cell.

12. The EEPROM cell of claim 11, wherein said unselected row of cells are provided approximately 10 volts to said WBL and said WLR and said WLR, and approximately 5 volts to said PT, said ACG and said PTG to prevent erasing of said unselected row of cells.

13. The EEPROM cell of claim 12, wherein said unselected column of cells are provided approximately 0 volts to said ACG, said WBL and said WLR, approximately 10 volts to said PT and approximately 5 volts to said PTG to prevent erasing of said unselected column of cells.

14. The EEPROM cell of claim 8, wherein a current flows between said tunneling source and said tunneling drain when said WBL and said PTG are provided approximately 0 volts, said ACG and said WLR is provided approximately 1.8 volts and said PT is provided approximately 0.9 volts.

15. The EEPROM cell of claim 14, wherein said tunneling transistor is an enhancement mode transistor.

16. The EEPROM cell of claim 8, wherein a current flows between said tunneling source and said tunneling drain when said WBL, said ACG and said PTG are provided approximately 0 volts, said WLR is provided approximately 1.8 volts and said PT is provided approximately 0.9 volts.

17. The EEPROM cell of claim 16, wherein said tunneling transistor is a depletion mode transistor.

18. The EEPROM cell of claim 4, wherein said tunnel oxide layer has a thickness of approximately 80 angstroms.

19. The EEPROM cell of claim 4, wherein said program junction oxide layer has a thickness of approximately 96 angstroms.

20. The EEPROM cell of claim 1, wherein said read transistor has a read gate oxide layer overlying said read channel, said read gate oxide layer having a thickness of approximately 150 angstroms.

21. An EEPROM cell, comprising:

a semiconductor substrate, said semiconductor substrate having an P conductivity type;

a first well formed in said semiconductor substrate, said first well having an N conductivity type, said first well electrically connected to a word bit line;

a second well formed in said first well, said second well having said P conductivity type, said second well electrically connected to said word bit line;

a tunneling transistor formed in said second well, said tunneling transistor having a tunneling source, a tunneling drain and a tunneling channel between said tunneling source and said tunneling drain, said tunneling drain and said tunneling source having an N conductivity type, said tunneling source electrically connected to a product term ground;

a program junction region formed in said semiconductor substrate, said program junction region separated from said tunneling transistor by a field oxide region, said program junction region being electrically connected to an array control gate;

a program junction oxide layer overlying said program junction region;

a read transistor formed in said semiconductor substrate, said read transistor electrically connected to said tunneling transistor through said tunneling drain, said read transistor having a read source and a read drain and a read channel between said read source and said read drain, said read source and said read drain having said N conductivity type, said read drain being electrically connected to a product term (PT); and a floating gate overlying said tunnel oxide layer and said program junction oxide layers wherein electron tunneling through said tunnel oxide layer occurs upon incurrence of a sufficient voltage potential between said floating gate and said tunneling channel.

* * * * *